United States Patent [19]

Hultquist et al.

[11] Patent Number: 4,936,877
[45] Date of Patent: Jun. 26, 1990

[54] DOPANT DELIVERY SYSTEM FOR SEMICONDUCTOR MANUFACTURE

[75] Inventors: Steven J. Hultquist, Raleigh, N.C.; Glenn M. Tom, New Milford, Conn.

[73] Assignee: Advanced Technology Materials, Inc., New Milford, Conn.

[21] Appl. No.: 381,583

[22] Filed: Jul. 18, 1989

[51] Int. Cl.$^5$ .............................................. B01D 53/22
[52] U.S. Cl. ........................................... 55/16; 55/18; 55/72; 55/158; 55/208; 55/267; 55/270
[58] Field of Search ................. 55/16, 18, 20, 72, 158, 55/159, 208, 267, 270

[56] References Cited

U.S. PATENT DOCUMENTS

| | | | |
|---|---|---|---|
| 1,685,759 | 9/1928 | Walter | 55/16 X |
| 3,721,065 | 3/1973 | Robicheaux et al. | 55/16 X |
| 4,325,715 | 4/1982 | Bowman et al. | 55/159 X |
| 4,398,654 | 8/1983 | Pong et al. | 55/159 X |
| 4,424,067 | 1/1984 | Tarasenko et al. | 55/16 |
| 4,461,165 | 7/1984 | Kesson | 55/159 X |
| 4,469,495 | 9/1984 | Hiraizumi et al. | 55/159 X |
| 4,683,039 | 7/1987 | Twardowski et al. | 55/16 X |
| 4,723,967 | 2/1988 | Tom . | |
| 4,738,693 | 4/1988 | Tom | 55/36 |
| 4,744,221 | 5/1988 | Knollmueller | 62/48 |
| 4,772,296 | 9/1988 | Potts | 55/72 X |
| 4,790,945 | 12/1988 | Baker | 55/72 X |
| 4,792,405 | 12/1988 | Baker | 55/72 X |

FOREIGN PATENT DOCUMENTS 63-111909 5/1988 Japan ...................... 55/158

OTHER PUBLICATIONS

R. N. Dietz and R. F. Wieser, "Sulfur Trioxide Permeation Tube For Calibration Of Sulfuric Acid Measurement Methods", Anal. Chem., 51, 2388-2391 (1979).
D. E. Saltzman, William R. Burg, and G. Ramaswamy, "Performance of Permeation Tubes as Standard Gas Sources," Environmental Science and Technology, 5, 1121-1128 (1971).
F. P. Scaringelli, A. E. O'Keeffe, E. Rosenberg, J. P. Bell, "Preparation of Known Concentrations of Gases and Vapors With Permeation Devices Calibrated Gravimetrically," Anal. Chem, 42, 871-876 (1979).
Techentrup and D. Klockow, "Preparation of Refillable Permeation Tubes," Anal. Chem., 50, 1728 91978).
"ASAT TM Microsensors for Chemistry," Integrated Chemical Sensors Corp. (Newton, Mss.) undated.

Primary Examiner—Robert Spitzer
Attorney, Agent, or Firm—Steven J. Hultquist

[57] ABSTRACT

A gas delivery system for supplying a vapor phase constituent at low concentration in a carrier gas, wherein the carrier gas is flowed through a contacting zone in which is disposed a permeable film through which the vapor phase constituent permeates into the contacing zone, to yield a product gas mixture comprising the vapor phase constituent and the carrier gas. In a particularly preferred embodiment, concentration of the vapor phase constituent in the product gas mixture is sensed, e.g., by a surface acoustical wave (SAW) concentration sensor device, and the concentration sensing is employed to controllably adjust the flow rate of the carrier gas flowed through the contacting zone, to maintain a selected delivery rate and concentration of the vapor phase constituent in the product gas mixture. The gas delivery system of the invention has particular utility for supplying gaseous dopant source compounds such as arsine, hydrogen selenide, and/or hydrogen telluride, for fabrication of semiconducting materials and semiconductor devices.

24 Claims, 4 Drawing Sheets

DOPANT DELIVERY SYSTEM FOR SEMICONDUCTOR MANUFACTURE

BACKGROUND OF THE INVENTION

1. Field of The Invention

This invention relates generally to a gas delivery system for supplying a constituent in the vapor-phase, at low concentration in a carrier gas, such as for example arsine, hydrogen selenide, and/or hydrogen telluride, in a carrier gas such as helium, nitrogen, or argon, for manufacture of semiconductors wherein the vapor-phase constituent is employed as a dopant source material.

2. Description of the Related Art

In the manufacture of semiconducting materials and semiconductor devices, a variety of gaseous compounds such as arsine, hydrogen selenide, and hydrogen telluride are employed as dopant source materials. These gaseous compounds are hazardous in character, and as a result of toxicity and safety considerations, must be carefully handled in the semiconductor manufacturing facility.

In conventional practice, these gaseous compounds are supplied in the semiconductor manufacturing plant from high pressure gas cylinders. With such high pressure gas cylinders, there is the associated danger of cylinder rupture resulting in gross introduction of the hazardous gases into the ambient environment in the manufacturing facility. There is also the danger of leakage from such cylinders, due to defects in or damage to the cylinder heads, gas flow regulators, and associated flow circuitry.

As an example, in the manufacture of silicon-based semiconductor devices, arsine is employed as a dopant source material, for arsenic doping of epitaxial semiconductor films, at relatively low concentrations, on the order of from about 20 to about 100 ppm. Even though utilized in dilute gas mixtures for such application, the arsine is typically provided in pure bulk form in high pressure gas cylinders, which as indicated entails the risk of rupture of and/or leakage from the cylinders, with the attendant consequence of release of arsine into the surrounding environment in the manufacturing plant.

As an alternative to the conventional requirement of high pressure gas cylinders of arsine or other dopant source gases in the semiconductor manufacturing plant, it would be desirable to provide a liquid source compound for dopants such as arsenic, selenium, and tellurium, which would obviate such requirement. Unfortunately, however, no suitable liquid source compounds for these dopants have been produced which yield semiconductor materials with the desired superior electrical properties.

It would therefore be a significant advance in the art to provide a means and method for supplying gaseous hydridic compounds of arsenic, selenium, and tellurium, which obviate the requirement of high pressure gas cylinders as source apparatus for such gas compounds in semiconductor manufacturing operations.

It therefore is an object of the present invention to provide a gas delivery system for supplying a constituent in the vapor-phase, at low concentration in a carrier gas, which may be usefully employed to supply gaseous hydrides of arsenic, selenium, and tellurium, for use as dopant source materials in semiconductor manufacturing operations.

It is another object of the present invention to provide a system for supplying a gaseous component in dilute concentration in a carrier gas, which yields a highly precise concentration of such dilute component in the carrier gas mixture comprising same.

Other objects and advantages in the present invention will be more fully apparent from the ensuing disclosure and the appended claims.

Relative to the gas delivery system of the present invention, as described hereinafter, related art includes U.S. Pat. Nos. 4,723,967 and 4,738,693 of G. M. Tom, which disclose a vessel for semiconductor source reagent dispensing and/or purification in which liquid-filled permeation tubes may be provided, as described for example at column 10, lines 11-32 of U.S. Pat. No. 4,738,693. Other related art includes the following articles: R. N. Dietz and R. F. Wieser, "Sulfur Trioxide Permeation Tube for Calibration of Sulfuric Acid Measurement Methods," *Anal. Chem.* 51, 2388-23391 (1979); B. E. Saltzman, William R. Burg, and G. Ramaswamy, "Performance of Permeation Tubes and Standard Gas Sources," *Environmental Science and Technology* 5, 1121-1128 (1971); F. P. Scaringelli, A. E. O'Keeffe, E. Rosenberg, and J. P. Bell, "Preparation of Known Concentrations of Gases and Vapors with Permeation Devices Calibrated Gravimetrically," *Anal. Chem.* 42, 871-876 (1970); and A. Techentrup and D. Klockow, "Preparation of Refillable Permeation Tubes," *Anal. Chem.* 50, 1728 (1978).

SUMMARY OF THE INVENTION

The present invention relates to a gas delivery system for supplying a selected constituent in the vapor-phase, at low concentration in a carrier gas.

The gas delivery system of the invention comprises a reservoir for containing the corresponding liquid, or pressurized vapor, of the aforementioned constituent The reservoir is joined, by selectively operable communication establishment means, in vapor transmission relationship with a permeation tube The permeation tube is disposed in a contacting chamber through which the carrier gas is flowed, to yield a gas mixture comprising the carrier gas and the dilute vapor-phase constituent which has permeated through the permeation tube into the contacting chamber, so that the permeant constituent has been taken up in the carrier gas to form the desired product gas mixture.

The invention in another aspect relates to a gas delivery system wherein a concentration sensor which is effective to sense the concentration of the dilute vapor phase constituent in the gas mixture, is employed to operatively adjust the flow rate of the carrier gas fed to the contacting chamber, to maintain a predetermined delivery rate and concentration of the dilute component in the product gas mixture.

Other aspects of the invention relate to methods of supplying a gas mixture comprising a dilute constituent in a carrier gas, utilizing the above-mentioned gas delivery systems.

Other aspects and features of the invention will be more fully apparent from the ensuing disclosure and appended claims.

DETAILED DESCRIPTION OF THE INVENTION, AND PREFERRED EMBODIMENT THEREOF

While the ensuing description will be directed primarily to the description of gas delivery systems for delivering gaseous dopant source material in semiconductor manufacturing operations, e.g., arsine, hydrogen selenide, and hydrogen telluride, it will be appreciated that the utility of the invention is not thus limited, but rather extends to the provision of any dilute constituent in the vapor (gaseous) phase, as a component of a carrier gas mixture comprising same.

As examples of other such applications, the gas delivery system of the invention may be employed for delivery of minute amounts of a reactant vapor phase material in a carrier gas, to facilitate study of the reaction kinetics and thermodynamic equilibrium of the vapor phase reactant with a co-reactant material with which the carrier gas mixture is subsequently contacted. The gas delivery system of the invention may also be employed for transport to a reactant chamber of a vapor phase reactant in a diluent carrier gas stream, in instances where the reaction is very highly exothermic in character, as a means of achieving a high degree of temperature control in the reaction.

In general, the gas delivery system of the present invention may be employed in any instances in which it is desired to provide a dilute component in a gas mixture at a low concentration. The invention has particular advantage in the supply of compounds having a critical temperature which is sufficiently high to permit ready liquefaction thereof, so that a vapor phase can be withdrawn from the liquid and passed through the permeation tube for incorporation in the carrier gas.

Thus, the invention has particular advantage in application to the delivery of arsine, hydrogen selenide, and hydrogen telluride at low concentration. The critical temperatures of these compounds are on the order of about 90° C., so that they accommodate liquefaction for the provision of the dilute component in liquid form, thereby permitting the gas delivery system to be of relatively small size.

Figure 1:
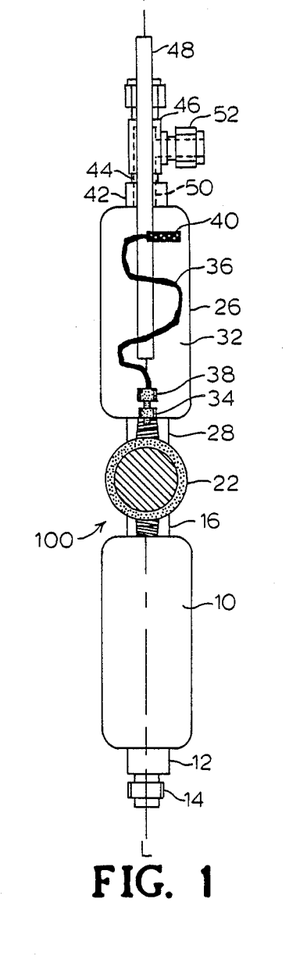
FIG. 1 is a front elevation view, in partial section, of a gas delivery system according to one embodiment of the present invention.
Figure 2:
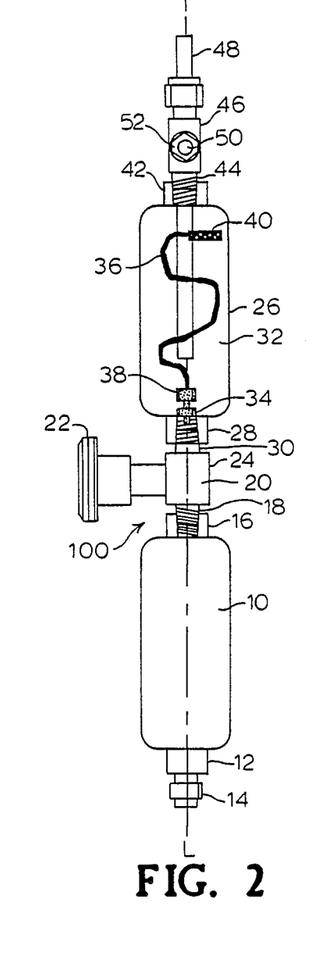
FIG. 2 is a side elevation view of the FIG. 1 gas supply system, in partial section.

FIG. 1 is a front elevation view in partial section, and FIG. 2 a corresponding side elevation view in partial section, of a gas delivery system 100 according to one embodiment of the present invention.

This gas delivery system comprises a reservoir 10 which may be of any suitable shape, as for example the generally cylindrical shape shown, for containing the liquid and/or vapor form of the component to be provided at low concentration in the product gas mixture discharged from the gas supply system. The reservoir 10 may suitably be formed of stainless steel or other appropriate material of construction, and is provided at its lower portion with a port 12 having an opening therein (not shown) through which the dilute component may be introduced to or withdrawn from the reservoir. A plug 14 is removably disposed in the port to leak-tightly seal the reservoir against leakage of the dilute component in use of the apparatus.

At its upper portion, the reservoir 10 is provided with a corresponding port 16, having a construction which is generally similar to port 12. Port 16 is provided with a threaded interior surface, which is complementarily threaded to matingly receive a threaded male extension 18 of the valve 20. Valve 20 may be of a bellows sealed type, with a manually actuatable handle 22 attached to the housing 24 of the valve, as shown.

Overlying the reservoir 10 and valve 20 is a mass transfer, or contacting, chamber 26, which may suitably be of cylindrical shape and formed of stainless steel or other suitable material of construction which is substantially impermeable to the exterior environment of the chamber. At a lower portion thereof, the contacting chamber is provided with a port 28 which is interiorly threaded to matingly receive a male extension 30 of valve 20, which is complementarily threaded with respect to the port interior opening.

The contacting chamber 26 encloses an interior volume 32. In this interior volume, the distal end 34 of the male extension 30 of valve 20 is joined in flow communication with a permeation tube 36, by means of the permeation tube coupling 38. At an opposite end of the permeation tube from the coupling 38 is a closure plug 40.

At its upper portion, the contacting chamber 26 is provided with a port 42 which is interiorly threaded to matingly receive a complementarily threaded male fitting 44 of the gas introduction and discharge assembly 46.

The gas introduction and discharge assembly 46 comprises a tubular conduit 48 extending from an upper end thereof exterior to the contacting chamber, through the main portion of the assembly and the male fitting 44 into the interior volume 32 of the contacting chamber 26, to a lower extremity which is in a lower portion of the interior space of the contacting chamber. The gas introduction and discharge assembly 46 is formed with a discharge passage 50 (see especially FIG. 1) communicating with the interior volume 32 of the contacting chamber 26 and the gas discharge fitting 52.

In the gas delivery system embodiment shown in FIGS. 1 and 2, the chamber 26 is of a same diameter as the dilute phase component reservoir 10, with the contacting chamber 26 being coaxially positioned above the reservoir 10, along the common longitudinal axis L—L of the gas delivery system.

In operation, the liquid contained in the dilute phase component reservoir 10 has a vapor phase overlying it, which is selectively admitted into the permeation tube 36 by opening of the bellows valve 20 from its normally closed position, by appropriate rotation of the valve handle 22. With such flow communication establishment between the permeation tube and reservoir, vapor flows from the reservoir through port 16, extension 18, valve housing 24, extension 30, port 28 and coupling 38, into the permeation tube 36.

Concurrently with the introduction of the vapor phase constituent into the permeation tube 36, carrier gas is introduced into the interior space 32 of the chamber 26 by means of gas introduction conduit 48, from the lower end of which the introduced carrier gas issues into the interior space 32.

The permeation tube is provided at its free end with a closure plug 40 which prevents bulk hydrodynamic flow of the dilute component from the permeation tube directly into the interior space 32 of the contacting chamber The permeation tube is constructed of a material which is permeable to the dilute component, so that as a result of permeation of the dilute vapor phase component through the wall of the permeation tube, the dilute component is introduced into the carrier gas flowing through the contacting chamber. The resulting gas mixture comprising the carrier gas and dilute component then passes through annular gas discharge passage 50 surrounding the gas introduction conduit 48 and is discharged from the gas delivery system at gas discharge fitting 52, which suitably may be joined to other flow conduit or manifold means for directing the resulting gas mixture to end use applications, such as a chemical vapor deposition chamber for the fabrication of silicon-based semiconductors, wherein the dopant element in the dilute vapor phase component is deposited together with a suitable source reagent for epitaxial film formation on a semiconductor substrate.

The permeation tube 36 may be formed of any suitable material of construction which is permeable to the selected component contained in the reservoir 10 and supplied in the vapor phase permeation tube. With regard to gases such as arsine, hydrogen selenide, and hydrogen telluride, the permeation tube may suitably be formed of a fluorocarbon polymer material, such as polytetrafluoroethylene (PTFE) or other suitable fluorocarbon or other polymers.

Permeation of materials through polymers is a well-known phenomenon and tabulated permeability values of a wide variety of materials potentially suitable for permeation tube structures may be employed to design a gas delivery system in accordance with the present invention for a specific dilute phase component.

In general, the permeation of a gas through a polymeric film is determined by the following equation $R = P \times SA \times CG$ wherein R = permeation rate in milliliters per second; P is the permeation constant for a given polymeric material, at standard temperature and pressure conditions, in units of cm $cm_{-2}$ $s^{-1}$ (cm Hg)$^{-1}$; SA is the surface area of the permeation surface, in units of $cm^2$; and CG is the concentration gradient, in (cm Hg)/cm.

These general parameters are constant for a given polymeric material of construction, fixed permeation tube geometry, and temperature. At constant temperature, the vapor pressure of a liquid source material for the dilute vapor phase component will be constant.

Accordingly, if the permeant, i.e., the dilute phase component which has passed through the permeable wall of the permeation tube to the interior space of the contacting chamber, is removed by the carrier gas, the concentration gradient across the walls of the permeation tube will be constant.

Figure 3:
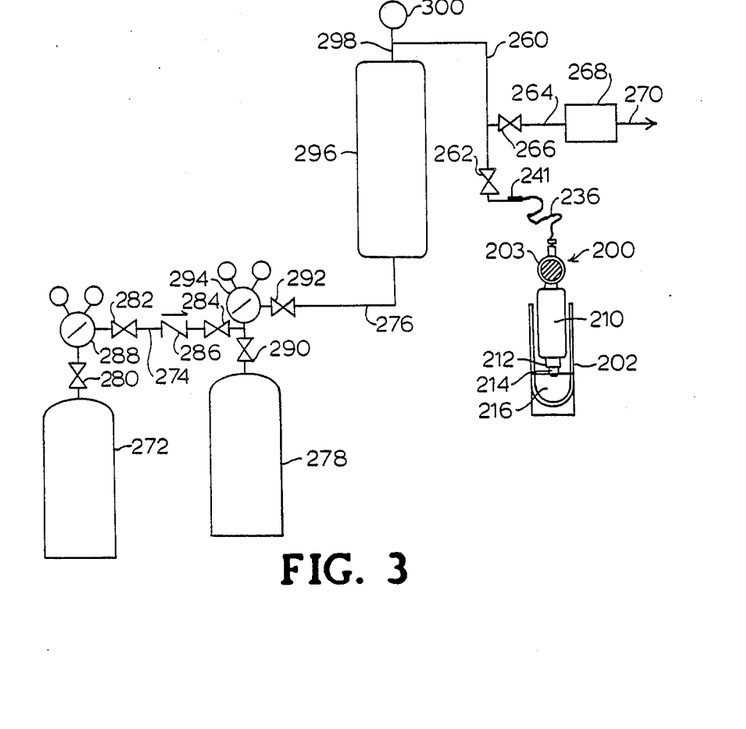
FIG. 3 is a schematic illustration of a process system for filling a supply reservoir of a gas delivery system according to one embodiment of the invention, with a selected constituent for subsequent dispensing thereof.

FIG. 3 is a schematic illustration of a system for filling a reservoir of a gas supply system of the type shown in FIGS. 1 and 2, wherein the contacting chamber and the associated gas introduction and discharge assembly have been removed to accommodate the filling operation.

As illustrated, the gas delivery system 200, devoid of the contacting chamber and associated gas introduction and discharge assembly shown in FIGS. 1 and 2, is disposed in an ice bath receptacle 202 with plug 214 secured in port 212 of the reservoir 210, and in contact with a volume 216 of ice. A fill tube 236 is joined by a coupling 241 to fill line 260 having fill valve 262 disposed therein Joined to fill line 260 is vent line 264 having vent valve 266 therein, the vent line 264 being connected to vent gas scrubber 268 Vent gas discharge line 270 is joined to the vent gas scrubber at an opposite end from vent line 264.

The remainder of the filling system for the gas delivery device comprises inert gas cylinder 272, joined by conduit 274 to conduit 276, with conduit 276 coupled to the dilute vapor phase component gas supply cylinder 278. Conduit 274 has disposed therein valves 280, 282, and 284, together with check valve 286 and regulator assembly 288, as shown. Conduit 276 has disposed therein valves 290 and 292, and regulator assembly 294. Conduit 276 is joined to rotameter 296, which in turn is joined to conduit 298 communicating at its exterior end with a pressure gauge 300.

The above-described filling system of FIG. 3 will now be described with reference to filling of the reservoir 210 of the gas supply system 200 with hydrogen selenide. This filling procedure may illustratively be carried out as follows.

First, the flow lines and manifold in the filling system may be dried with helium gas supplied from helium gas supply cylinder 272, with valves 280, 282, 284, 292, and 266 open, and valves 290 and 262 closed Helium flow is maintained for sufficient time, e.g., 2–12 hours, to thoroughly dry the regulator assemblies and associated flow circuitry.

Next, the fill tube 236, while unattached to the valve structure of the gas supply system, is placed in a glove box and purged with helium gas Such purging is carried out to remove any extraneous atmospheric gases from the walls and interior porosity of the tube, and is carried out for 12–24 hours. Following the purging of the tube, the tube is connected to the valve 203 of the gas supply system, and the entire flow circuitry and reservoir 210 are subjected to pressure swing cycling to remove water and oxygen from the system. A vacuum pump (not shown) may be attached at vent line 264 in lieu of the vent gas scrubber 268, and employed to apply vacuum to the system, with the valves 280 and 290 closed, and all other valves open. Following the vacuum portion of the cycle, the valve 266 may be closed, and the system pressurized with helium from cylinder 272, by opening of valve 280. Following pressurization, the valve 280 is again closed, and valve 266 again opened, with actuation of the vacuum pump to accommodate the vacuum portion of the pressure swing cycle. This pressure swing operation is carried out for 10–30 cycles, until water and oxygen are substantially completely removed from the system. The valve 203 to the reservoir 210 then is closed, along with valve 280. The vent valve 266 is closed when the pressure in the reservoir 210 reaches 0 psig.

The valve 240 in conduit 276 joined to the hydrogen selenide cylinder 278 then is opened, while valves 280, 282, 284, 266, and 262 are closed, so that hydrogen selenide is introduced into the flow circuitry at a pressure of about 30 psig. Next, the hydrogen selenide isolation valve 292 is closed, and the fill valve 262 is opened, so that a quantity, e.g., two liters (STP), of hydrogen selenide is transferred into the reservoir 210. If additional hydrogen selenide is required in the reservoir, the pressurization of the flow circuit and transfer to the reservoir 210 should be repeated in the manner previously described. After the proper amount of hydrogen selenide has been transferred to the reservoir 210, the gas supply valve 203 of the gas supply system 200 should be closed, together with fill valve 262. Thereafter, the vent valve 266 is opened, and the flow circuitry is flushed with the inert carrier gas from cylinder 272, utilizing pressurizing/venting cycles.

The gas supply system including the permeation tube then is placed into a glove box antechamber (not shown) with associated wrenches, premeation tube, and the top assembly of the gas supply system comprising the contacting chamber and associated gas introduction and discharge assembly. The antechamber then is purged, and the aforementioned portions of the gas supply system placed into the glove box.

In the glove box, the permeation tube is attached to the valve 203 connected to the reservoir 210. The partially assembled gas supply system then is taken out of the glove box, and the upper assembly thereof is attached to the valve 203, to yield the completed gas supply system as is shown in FIGS. 1 and 2. Helium flush lines next are attached to the gas introduction conduit, and the upper section of the gas supply system, including the interior space of the contacting chamber, is purged. Finally, the gas supply system is checked to insure its leak-tightness as assembled, following which the gas supply system is in operative condition, to supply hydrogen selenide from the reservoir 210 to the permeation tube in the contacting chamber when valve 203 is selectively opened.

Figure 4:
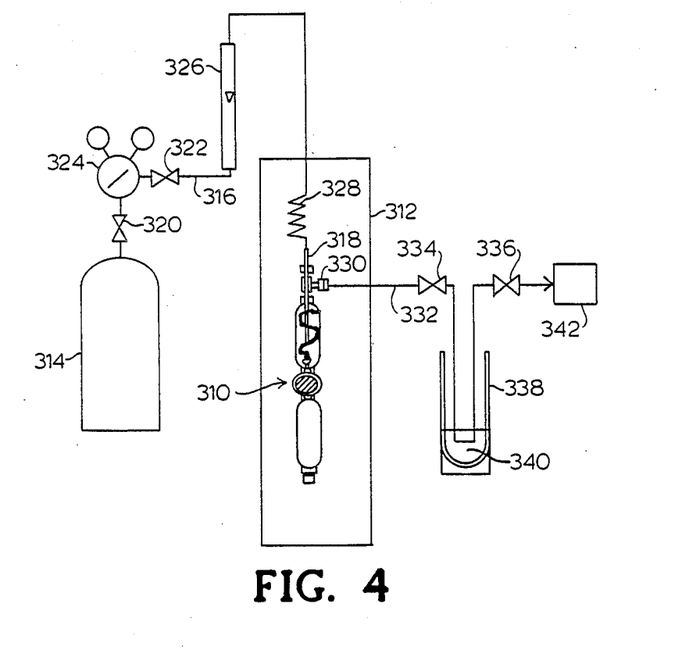
FIG. 4 is a schematic representation of a process system for determining delivery rate of a dilute gaseous constituent from a gas delivery system according to one embodiment of the present invention.

FIG. 4 shows a system for determining the flow rate characteristics of the gas supply system as assembled.

As shown in FIG. 4, the gas supply system 310 is disposed in an oven enclosure 312 provided with suitable heating means (not shown for clarity). A cylinder 314 of nitrogen gas is connected by gas feed conduit 316 to the gas introduction conduit 318 of the gas supply system 310. The gas feed conduit 316 has disposed therein valves 320, and 322, regulator assembly 324, rotameter 326, and, within the oven 312, a portion of the length of conduit 316 forms a heat exchange coil 328. The gas discharge coupling 330 of the gas supply system 310 is joined to gas discharge conduit 332 which has valves 334 and 336 disposal therein and comprises a portion of its length disposed in liquid nitrogen vessel 338, containing a volume of liquid nitrogen 340. The gas discharge conduit 332 downstream of the liquid nitrogen vessel 338 is attached to a gas chromatograph 342.

In use of the rate measurement system shown in FIG. 4, after the system has been thoroughly sparged out by inert carrier gas such as helium, the rate measuring system is operated by opening valves 320, 322, 334, and 336 to flow nitrogen through conduit 316, heat exchange coil 328, and through the contacting chamber of the gas supply system 310 to produce a hydrogen selenide-containing nitrogen gas stream, which is then discharged from the gas supply system in gas discharge conduit 332 and passed to the gas chromatograph 342. The portion of the gas discharge conduit 332 associated with the liquid nitrogen vessel 338 comprises a preconcentrator trap for the gas chromatograph, with the conduit for example comprising a 0.25 inch outer diameter stainless steel U-shaped tube immersed in the liquid nitrogen 340 in the trap.

The sample is passed through the trap for a timed interval, at a known flow rate, while the U-tube is immersed in the liquid nitrogen After a selected amount of gas has been passed through the preconcentrator, the outlet valve 336 and the inlet valve 334 of the trap are closed. The U-shaped tube then is removed from the liquid nitrogen and warmed to approximately room temperature, following which the outlet valve 336 is opened to permit gas sampling by the gas chromatograph.

The flux of the hydrogen selenide then is determined as a function of flow rate, temperature, length of the permeation tube, and rate of equilibration, while varying the various system parameters.

For example, the flow rate may be varied from 0.2 to 1 liter per minute to determine the absolute delivery rate of the hydrogen selenide, and the response characteristics of the gas supply system. Permeation rate may be measured at selected temperatures, such as 30° C., 35° C., 40° C., and 45° C. to determine the operating characteristics of the system at varying temperature.

The measuring system of FIG. 4 may also be employed to evaluate the effect of varying the length of the permeation tube. The permeation tube preferably is of coiled or other "packed" configuration in the interior space of the mass transfer chamber, in order to permit a compact gas supply system to be achieved, while providing sufficient permeation surface to adequately supply the dilute vapor phase component to the carrier gas For example, the permeation tube may be helically coiled, with a length of 5 feet. It will be appreciated that the specific length and wall thickness characteristics of the permeation tube may be varied widely depending on the specific dilute component which is desired to be permeably transferred from the reservoir of the gas supply system to the carrier gas in the contacting chamber, as well as the specific flow rate and concentration characteristics required for the dilute component, depending on the end use application in which the gas mixture comprising the dilute component is to be utilized.

Figure 5:
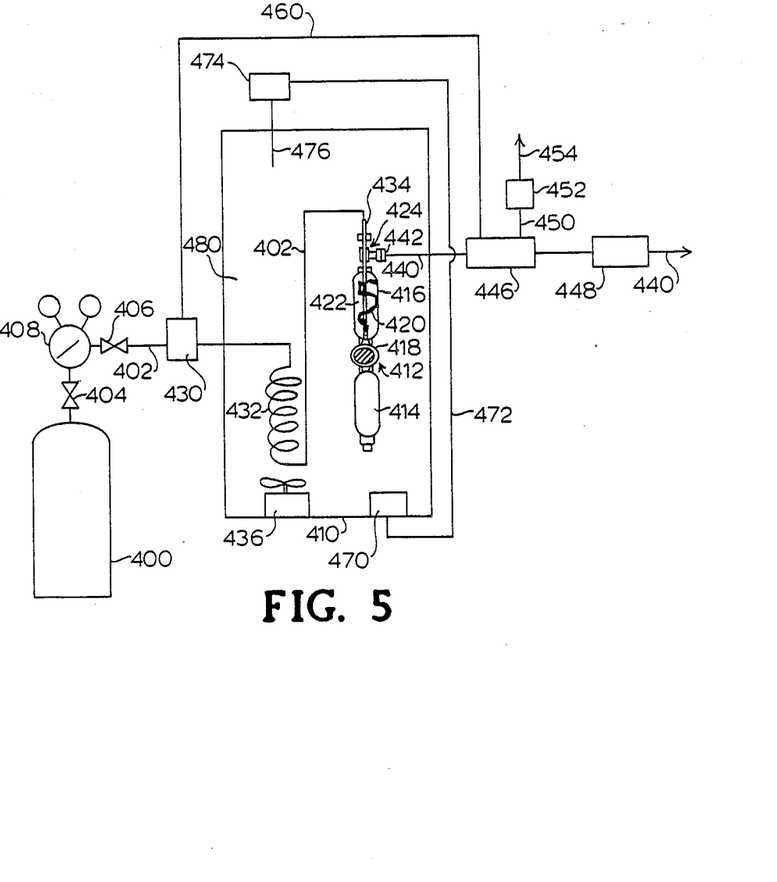
FIG. 5 is a schematic illustration of a gas delivery system according to another embodiment of the present invention, comprising means for sensing the concentration of the dilute component in the effluent gas mixture from the delivery system, and controllably adjusting the feed rate of the carrier gas, to maintain a predetermined supply rate and concentration of the dilute component in the product gas mixture discharged from the system.

FIG. 5 is a schematic depiction of a system for supplying a vapor phase (gaseous) component in a gas mixture, at low concentration, wherein the delivery rate and concentration of the dilute component in the product gas mixture from the gas delivery system is closely controllable.

The system shown in FIG. 5 comprises a carrier gas source cylinder 400 having joined thereto a gas feed conduit 402 with valves 404 and 406, and regulator assembly 408 disposed therein.

A constant temperature enclosure 410 is provided, containing a gas supply system 412. The gas supply system suitably may be of a type as illustratively described hereinabove in connection with FIGS. 1–2 hereof, and comprises a reservoir 414 coaxially aligned with a contacting chamber 416 thereabove. Interposed between the overlying contacting chamber and the dilute component reservoir is a flow control valve 418, to selectively establish flow communication between the reservoir 414 and a permeation tube 420 disposed in the interior space 422 of the contacting chamber. The gas supply system further comprises a carrier gas inlet and gas mixture discharge assembly 424 which is of a same type as shown and described in connection with FIGS. 1 and 2. The feed gas conduit 402 has a mass flow controller 430 disposed therein and extends into the constant temperature enclosure 410, within which the conduit comprises as a portion of its length a heat transfer coil 432. The feed conduit 402 downstream of the heat transfer coil is joined to the gas introduction conduit 434 of the gas supply system 412. Disposed beneath the heat transfer coil 432 is a fan 436, joined to suitable power supply means (not shown). A gas discharge conduit 440 is joined to gas discharge coupling 442 of the gas supply system 412. The gas discharge conduit 440 extends externally of the constant temperature enclosure 410 and has disposed therein, in series arrangement as shown, a concentration sensing means 446 and a mass flow controller 448. Joined to the concentration sensor 446 by line 450 is a check valve pressure controller 452, to which in turn is joined over-pressure gas discharge line 454.

Also joined to concentration sensor 446, by means of control signal wire 460, is the aforementioned mass flow controller 430 in gas feed conduit 402.

Disposed in the constant temperature enclosure 410 is a heater 470 joined to suitable power supply means (not shown). The heater is coupled by means of signal transmission wire 472 to temperature controller 474. Temperature controller 474 in turn is joined to temperature sensor 476 which extends into the constant temperature enclosure 410 as shown.

The constant temperature enclosure 410 thus defines an enclosed interior volume 480 in which are disposed the gas supply system 412, fan 436, heater 470, heat exchange coil 432, and temperature sensor 476, in operative relationship with one another as shown.

In the operation of the FIG. 5 gas delivery system, the valves 404 and 406 in gas feed conduit 402 are opened to flow carrier gas, such as for example helium, through valve 404, regulator assembly 408, valve 406, and mass flow controller 430 into the constant temperature enclosure. In the enclosure, the carrier gas is passed through the coiled portion of the gas feed conduit defining the heat transfer coil 432 and subsequently is introduced to the gas supply system 412 through gas introduction conduit 434, for discharge into the interior space 422 of contacting chamber 416.

During this operation, the temperature in the enclosed interior volume 480 of the constant temperature enclosure 410 is continuously monitored by temperature sensor 476, which may for example comprise a thermocouple temperature sensor element, connected to a resistivity-type temperature controller 474. In response to the temperature sensed by sensor 476, temperature controller 474 generates a control signal which is transmitted by signal transmission wire 472 to the heater 470, to controllably operate same so that the desired heating of the enclosed interior volume 480 is achieved, and so that the interior volume of enclosure 410 is maintained at a selected constant temperature. Concomitantly, the fan 436 is operated to circulate air over the heat exchange coil 432, to ensure that the influent carrier gas in gas feed conduit 402 is brought to a selected temperature, for subsequent introduction to the interior space 422 of contacting chamber 416 of the gas supply system 412.

After the contacting of the carrier gas with the permeant gas from the permeation tube 420 has been effected in the mass transfer chamber 416, the resulting product gas comprising the carrier gas and dilute gas component is discharged in gas discharge conduit 440 and passes to the concentration sensor 446. This concentration sensor may be of any suitable type which is effective to provide a determination or output signal representative of the concentration of the dilute component in the gas mixture flowed therethrough, under the process conditions encountered. In a preferred aspect, the concentration sensor 446 comprises a surface acoustical wave (SAW) chemical concentration sensor, whereby concentration of a gaseous constituent in a gas mixture is determined by binding of the molecules of the gas to be measured, to a piezoelectric crystal surface between two sets of electrodes which respectively generate and receive mechanical (acoustic) waves, so that the molecules attached to the surface of the piezoelectric crystal will change the wave velocity to an extent which is proportional to the number of molecules bound to the surface. Concentration sensors of this type are commercially available under the trademark BION TM, from Integrated Chemical Sensors Corporation, Newton, Mass.

The concentration sensor 446 thus senses the concentration of the dilute component in the gas mixture flowed through gas discharge conduit 440 and generates a control signal which is transmitted via signal transmission wire 460 to the mass flow controller 430. By this arrangement the mass flow controller is controllably adjusted to selectively vary the flow rate of carrier gas introduced to the contacting chamber 416 from gas feed conduit 402, so as to achieve a selected delivery rate and concentration of the dilute component in the product gas discharged from the gas supply system in gas discharge conduit 440.

In order to maintain the pressure in the concentration sensor at a constant value for concentration sensing purposes, the concentration sensor 446 may be joined by conduit 450 to check valve pressure controller 452, which vents over-pressure in the concentration sensor to discharge line 454. The vented over-pressure gas may then be passed to suitable gas sorption or purification means (not shown) for recovery of the dilute phase component, if desired. Accordingly, product gas containing the dilute component at a predetermined concentration flows in gas discharge conduit 440 through second mass flow controller 448 and then is discharged to downstream processing or end use facilities, such as for example a chemical vapor deposition chamber to which the dilute component may be introduced to provide a dopant species in the vapor being employed to form an epitaxial film on wafer substrates to yield semiconductor devices.

Thus, the deployment of the concentration sensor in controlling relationship with the mass flow controller in the carrier gas feed conduit permits the system to be operated to produce a predetermined delivery rate and concentration of dilute component in the product gas mixture.

While the invention has been illustratively shown and described with reference to particular embodiments, features, and aspects thereof, it will be appreciated that numerous variations, modifications, and other embodiments may be employed, and accordingly, all such variations, modifications, and embodiments are to be regarded as being within the spirit and scope of the invention.

What is claimed is:

1. A gas delivery system for supplying a constituent in the vapor phase at low concentration in a carrier gas, comprising:
   (a) a reservoir for supplying said constituent in the vapor phase;
   (b) a contacting chamber comprising an enclosed space for contacting the carrier gas with vapor phase constituent therein;
   (c) means for introducing the carrier gas into the contacting chamber for contacting with said gaseous constituent therein to form a gas mixture comprising said vapor phase constituent and the carrier gas;
   (d) means for discharging the gas mixture comprising said vapor phase constituent and the carrier gas from the contacting chamber;
   (e) a permeation tube disposed in the contacting chamber in selectively establishable fluid flow communication with the reservoir to receive said vapor phase constituent therefrom, for permeation of the vapor phase constituent through the permeation tube into the enclosed space in the contacting chamber; and
   (f) fluid communication control means disposed between the reservoir and the permeation tube, for selectively establishing fluid flow communication from the reservoir to the permeation tube.

2. A gas delivery system according to claim 1, wherein the reservoir and the contacting chamber are each elongate in form, and coaxial with respect to one another, with the contacting chamber being positioned above the reservoir.

3. A gas delivery system according to claim 1, wherein the fluid communication control means comprise a bellows sealed valve.

4. A gas delivery system according to claim 1, wherein the permeation tube is of a length which is greater than the length of the enclosed space in the contacting chamber.

5. A gas delivery system according to claim 1, wherein the permeation tube is in a coiled form in the enclosed space in the contacting chamber.

6. A gas delivery system according to claim 1, wherein the permeation tube is formed of a fluorocarbon polymer.

7. A gas delivery system according to claim 1, wherein the permeation tube is formed of polytetrafluoroethylene.

8. A gas delivery system according to claim 1, wherein the contacting chamber is vertically elongate and said means for introducing the carrier gas into the contacting chamber comprise a gas feed conduit depending downwardly in the contacting chamber and terminating at a lower portion of the enclosed space in the contacting chamber.

9. A gas delivery system according to claim 8, wherein the permeation tube is coiled about the gas feed conduit in the enclosed space in the contacting chamber.

10. A gas delivery system according to claim 9, wherein the reservoir and the contacting chamber are both vertically elongate, and coaxial with respect to one another, with the contacting chamber being positioned above the reservoir.

11. A gas delivery system according to claim 1, wherein the reservoir contains a compound selected from the group consisting of arsine, hydrogen selenide, hydrogen telluride, and mixtures thereof.

12. A gas delivery system according to claim 1, mounted in a constant temperature enclosure.

13. A gas delivery system according to claim 12, wherein the means for introducing the carrier gas into the contacting chamber comprise a carrier gas feed conduit including a heat exchange coil through which the carrier gas is flowed to adjust the temperature of the carrier gas to the temperature of the constant temperature enclosure.

14. A gas supply system according to claim 13, wherein:
   (i) said means for introducing the carrier gas into the contacting chamber extend into said constant temperature enclosure and are joined to the heat exchange coil therein;
   (ii) a mass flow controller is disposed in said carrier gas feed conduit, exteriorly of said enclosure;
   (iii) said means for discharging said gas mixture comprising the vapor phase constituent and carrier gas from the contacting chamber comprises a carrier gas effluent conduit extending from the contacting chamber out of the constant temperature enclosure, said carrier gas effluent conduit having disposed therein, exteriorly of said constant temperature enclosure, concentration sensing means for sensing the concentration of said constituent in the gas mixture flowed through said carrier gas effluent conduit; and
   (iv) control means responsive to the concentration sensed by the concentration sensing means in the gas mixture flowed through said carrier gas effluent conduit, for controllably adjusting said mass flow controller to maintain a selected concentration and delivery rate of said constituent in the gas mixture produced by contacting of the carrier gas with said constituent in the contacting chamber.

15. A gas supply system according to claim 14, further comprising a second mass flow controller in said gas mixture discharge effluent conduit.

16. A gas supply system according to claim 14, wherein said concentration sensing means comprises a surface acoustical wave device.

17. A gas supply system according to claim 16, wherein said concentration sensing means has associated therewith a means for maintaining constant pressure in the concentration sensing means.

18. A gas delivery system according to claim 14, wherein said constant temperature enclosure contains heating means.

19. A gas delivery system according to claim 18, comprising means for controlling temperature in said enclosure, including a temperature sensing means for sensing temperature in said enclosure, and means responsive to temperature sensed by said temperature sensing means for controllably adjusting said heating means to maintain a predetermined temperature in said enclosure.

20. A gas delivery system according to claims 19, wherein said constant temperature enclosure contains a fan positioned in effective relationship to said heat transfer coil to circulate gas in said enclosure about said heat exchange coil.

21. A gas delivery system for supplying a constituent in the vapor phase at low concentration in a carrier gas, comprising:
    a receptacle for said constituent;
    a contacting chamber;
    means for flowing carrier gas through said contacting chamber;
    a permeable membrane enclosure disposed in said contacting chamber and joined in selectively establishable flow communication relationship to said receptacle; and
    means for selectively establishing flow communication between said receptacle and said permeable membrane enclosure, to controllably flow said constituent from said receptacle to said permeable membrane enclosure in said contacting chamber.

22. A method of supplying a vapor phase constituent at low concentration in a carrier gas, comprising:
    providing a gas delivery system according to claim 21;
    selectively establishing flow communication between said receptacle and said permeable membrane enclosure; and
    flowing said carrier gas through said contacting chamber to incorporate therein vapor phase constituent permeated through said permeable membrane enclosure into said contacting chamber, to produce a product gas mixture comprising said vapor phase constituent in said carrier gas.

23. A gas delivery system for supplying a vapor phase constituent at selected low concentration in a carrier gas, comprising:
    a source of said vapor phase constituent including a permeable film through which said vapor phase constituent permeates to a second side of said film opposite a first side thereof at which vapor of said constituent is present;
    means for flowing said carrier gas past said second side of said permeable film at a predetermined flow rate to yield a product gas mixture comprising said vapor phase constituent and carrier gas;
    concentration sensing means for sensing concentration of said vapor phase constituent in said gas mixture and controllably adjusting said carrier gas flow means to obtain a selected concentration of said vapor phase constituent in said gas mixture.

24. A method of supplying a vapor phase constituent at a selected low concentration in a carrier gas, comprising:
    providing a permeable film having on a first side thereof a source of said vapor phase constituent, said permeable film permitting permeation of said vapor phase constituent from said first side of said film to a second, opposite side thereof;
    flowing said carrier gas over said second surface of said permeable film to form a gas mixture comprising vapor phase constituent permeated through said film, and carrier gas;
    sensing concentration of said vapor phase constituent in said gas mixture; and
    responsive to the concentration sensed in said gas mixture of said vapor phase constituent, controllably adjusting the flow rate of carrier gas over the permeable film to obtain a selected concentration of vapor phase constituent in said gas mixture.

* * * * *

UNITED STATES PATENT AND TRADEMARK OFFICE
CERTIFICATE OF CORRECTION

PATENT NO. : 4,936,877

DATED : June 26, 1990

INVENTOR(S) : Steven J. Hultquist and Glenn M. Tom

It is certified that error appears in the above-identified patent and that said Letters Patent is hereby corrected as shown below:

Column 2, line 45, after "tube" insert --.--.

Column 4, Line 8, after "system" insert --.--.
Column 5, Line 54 change "cm-2" to --cm$^{-2}$--.
Column 6, Line 14, after "therein" insert --.--
Column 6, Line 16, after "268" insert --.--
Column 6, Line 39, after "closed" insert --.--
Column 6, Line 45, after "gas" insert --.--.
Column 8, Line 36, after "gas" insert --.--.

Signed and Sealed this

Twenty-second Day of October, 1991

Attest:

HARRY F. MANBECK, JR.

*Attesting Officer*                *Commissioner of Patents and Trademarks*